United States Patent [19]

Sugimoto

[11] Patent Number: 4,719,370
[45] Date of Patent: Jan. 12, 1988

[54] BIMOS HIGH SPEED INVERTER CIRCUIT

[75] Inventor: Yasuhiro Sugimoto, Yokohama, Japan

[73] Assignee: Kabushiki Kaisha Toshiba, Kawasaki, Japan

[21] Appl. No.: 804,473

[22] Filed: Dec. 4, 1985

[30] Foreign Application Priority Data

Jul. 1, 1985 [JP] Japan ................. 60-142585

[51] Int. Cl.⁴ ............. H03K 19/02; H03K 5/12; H03K 5/01; H03K 17/60
[52] U.S. Cl. ......................... 307/446; 307/263; 307/268; 307/570
[58] Field of Search .......... 307/570, 270, 446, 246, 307/263, 268, 445

[56] References Cited

U.S. PATENT DOCUMENTS 3,619,659 11/1971 Meyer et al. ................. 307/263
4,425,516 1/1984 Wanlass ........................ 307/446

FOREIGN PATENT DOCUMENTS 0145004 6/1985 European Pat. Off. ........... 307/446
59-205828 11/1984 Japan .

Primary Examiner—John S. Heyman
Assistant Examiner—M. R. Wambach
Attorney, Agent, or Firm—Schwartz, Jeffery, Schwaab, Mack, Blumenthal & Evans

[57] ABSTRACT

An improved inverter circuit capable of attaining complete swift inversion is shown. The circuit comprises bipolar transistors (27, 29) by which an inverted output takes a level near the rated level and MOS transistors (21, 23) by which the inverted output reaches the rated level from the near level. The MOS transistor (21, 23) is driven by a bipolar transistor (31) and possesses high current driving capacity with its large dimensions of the gate region.

7 Claims, 5 Drawing Figures

BIMOS HIGH SPEED INVERTER CIRCUIT

BACKGROUND OF THE INVENTION

1. Field of the Invention

The present invention relates to an inverter circuit for inverting an input signal, in particular, to an inverter circuit which improves fast operability of a load which is connected to the output.

2. Description of the Prior Art

Recently, there has been proposed an inverter circuit which, through use at the output stage of a bipolar transistor and a CMOS transistor, makes it possible to carry out fast operation for a capacitive load as well as to obtain an output level which is the same as that of a CMOS output circuit, without increasing the size of the circuit (see, for example, Japanese Pat. No. 59-205828).

In such a widely used circuit construction, a pair of bipolar transistors serially connected to each other between high and low voltage sources are turned-on or turned-off, but are always opposite in relation to each other, to obtain an inverted output signal at an intermediate connection therebetween. Practically, a turn-on state of the bipolar transistor holds a certain remaining voltage $V_{BE}$ between its base and emitter, instead of being in a complete conductive condition. To compensate for such remaining voltage bias a subsidiary MOS transistor is employed which is capable of being in a substantially complete conductive condition. Thus it is desired to accomplish an increased switching speed of the MOS transistor to improve inversion speed. Fast operation of the MOS transistor depends on the dimensions of the gate region.

However, increasing the dimensions of the MOS transistor means that the gate capacity of the transistors is increased. This results in the inconvenience that a driving circuit with high current driving capability has to be connected to the input terminal to drive the transistor. Thus, when the driving circuit is to be constructed, for example, by the use of a CMOS transistor, it will give rise to a problem that the driving circuit has to be made large.

SUMMARY OF THE INVENTION

It is an object of the present invention to provide an inverter circuit which can carry out an inverting operation at a high speed.

It is another object of the present invention to construct a small size inverter circuit that can carry out an inverting operation at a high speed.

It is still another object of the present invention to provide a high speed inverting circuit which can be driven by a driving circuit that possesses an ordinary driving capability.

In order to accomplish the above objects, the present invention is characterized in that the circuit has an output stage constructed by bipolar transistors that are connected in the so-called totem-pole fashion, and includes a conversion circuit for inverting the input signal, a P-channel MOS transistor which is connected between the output terminal and a higher voltage source, an N-channel MOS transistor which is connected between the output terminal and a lower voltage source, an NPN-type bipolar transistor which has its base terminal connected to the input terminal, its collector terminal connected to the higher voltage source, and its emitter terminal connected to the gate terminals of the P-channel MOS transistor and the N-channel MOS transistor, and an N-channel MOS transistor which has its drain terminal connected to the gate terminals of the P-channel MOS transistor and the N-channel MOS transistor, its source terminal connected to the lower voltage source, and its gate terminal is input by the signal which is the inversion of the input signal.

BRIEF DESCRIPTION OF THE DRAWING

These and other objects, features and advantages of the present invention will be more apparent from the following description of the preferred embodiments, taken in conjunction with the accompanying drawings, in which.

DESCRITION OF THE PREFERRED EMBODIMENTS

To facilitate the understanding of the present invention a brief reference will be made to a prior art circuit.

Figure 1:
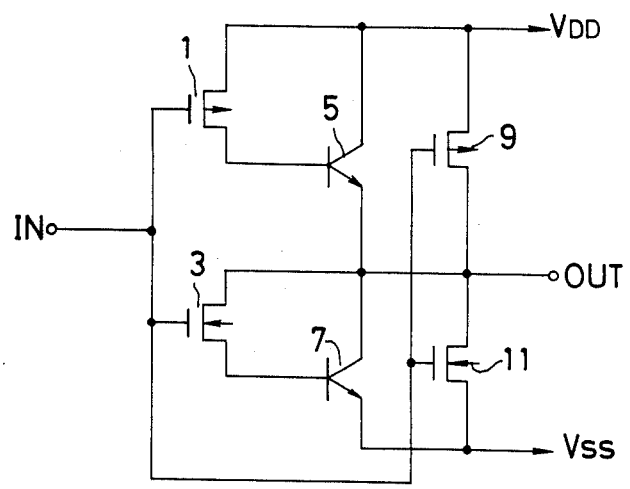
FIG. 1 is a block diagram of a prior art inverter circuit.

In FIG. 1 the circuit inverter which is proposed in Japanese Pat. No. 59-205828 is shown. In such a circuit construction, if, for example, the output voltage is to be inverted from the high level (power source potential $V_{DD}$) to the low level (potential $V_{SS}$ which is O V ordinarily), the output voltage is lowered from a potential $V_{DD}$ to a potential $(V_{SS}+V_{BE2})$ (here, $V_{BE2}$ is the voltage between the base and emitter of a bipolar NPN transistor 7 which is about 0.7 V) by the action of a bipolar NPN transistor 7, and then is lowered from the potential $(V_{SS}+V_{BE2})$ to the potential $V_{SS}$ by means of an N-channel MOS transistor 11.

Now, when such an inverter circuit is to be used together with the TTL digital circuit while maintaining the fast operation of the TTL digital circuit, the lowering of the ouput voltage from the potential $(V_{SS}+V_{BE2})$ to the potential $V_{SS}$ has to be carried out fast since the low level ouput voltage $V_{OL}$ of the TTL digital circuit is generally about 0.4 V. In order to accomplish this, the dimensions (the ratio of W to L) of the N-channel MOS transistor 11 have to be chosen large. Further, when the output voltage is to be inverted from the low level to the high level, the output voltage is raised from a potential $(V_{DD}-V_{BE1})$ (here, $V_{BE1}$ is the voltage between the base and the emitter of a bipolar NPN transistor 5) to the potential $V_{DD}$ by a P-channel MOS transistor 9. Accordingly, if the inverting operation of the output voltage from the low level to the high level is to be carried out fast, the dimensions of the P-channel MOS transistor have to be chosen large.

However, increasing the dimensions of the P-channel MOS transistor 9 and the N-channel MOS transistor 11 means that the gate capacity of both transistors 9 and 11 is increased. This results in the inconvenience that a driving circuit with high current driving capability has to be connected to the input terminal IN to drive both transistors 9 and 11. Thus, when the driving circuit is to be constructed, for example, by the use of a CMOS transistor, it will give rise to a problem that the driving circuit has to be made large.

In what follows there will given a description on the embodiments of the present invention.

Figure 2:
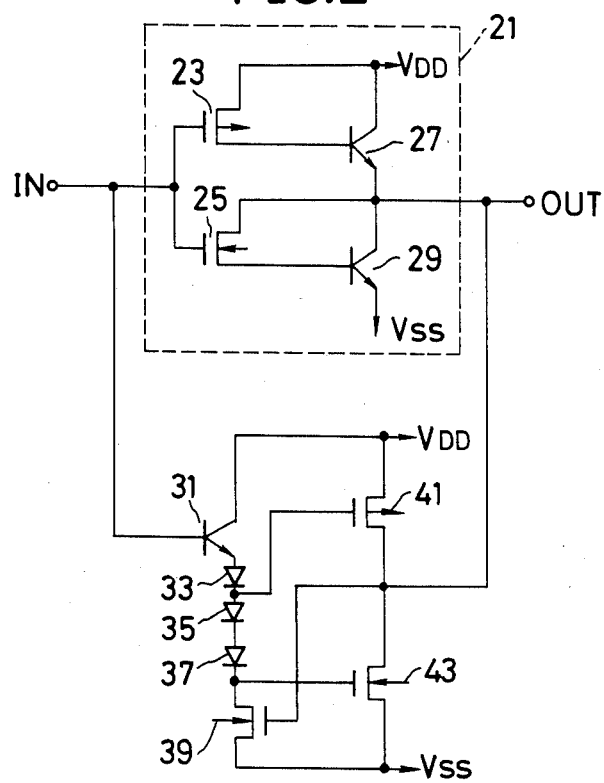
FIG. 2 is a block diagram of the inverter circuit relating to a first embodiment of the present invention.

In FIG. 2 the inverter circuit relating to a first embodiment of the present invention is shown. First, its construction will be described. In FIG. 2, reference numeral 21 illustrates a conversion circuit for carrying out an inverting operation on an input signal by a mixed use of bipolar and CMOS transistors. The input stage of the conversion circuit 21 is constituted by a first P-channel MOS transistor 23 and a first N-channel MOS transistor 25. The first P-channel MOS transistor 23 has its gate terminal connected to the input terminal IN to which a signal to be inverted is applied, and its source terminal connected, for example, to a voltage source $V_{DD}$ which supplies a potential $V_{DD}$. The first N-channel MOS transistor 25 has its gate terminal connected to the input terminal IN, and its drain terminal connected to the ouput terminal OUT from which the inverted signal is output.

The output stage of the conversion circuit 21 is constituted by a first bipolar NPN transistor 27 and a second bipolar NPN transistor 29. The first NPN transistor 27 has its base terminal connected to the drain terminal of the first P-channel MOS transistor 23, its collector terminal connected to the voltage source $V_{DD}$, and its emitter terminal connected to the ouput terminal OUT. The second NPN transistor has its base terminal connected to the source terminal of the first N-channel MOS transistor 25, its collector terminal connected to the output terminal OUT, and its emitter terminal connected to a voltage source $V_{SS}$ which gives a potential $V_{SS}$ (ordinarily 0 V).

A third bipolar NPN transistor 31 has its base terminal connected to the input terminal IN, its collector terminal connected to the voltage source $V_{DD}$, and between its emitter terminal and the drain terminal of a second N-channel MOS transistor 39 there are connected diodes 33, 35 and 37 in series. The gate terminal of the second N-channel MOS transistor 39 has its gate terminal connected to the output terminal OUT and its source terminal connected to the $V_{SS}$ terminal.

A second P-channel MOS transistor 41 has its gate terminal connected to the anode of the diode 35, its source terminal connected to the $V_{DD}$ terminal, and its drain terminal connected to the ouput terminal OUT. A third N-channel MOS transistor 43 has its gate terminal connected to the drain terminal of the second N-channel MOS transistor 39, its source terminal connected to the $V_{SS}$ terminal, and its drain terminal connected to the ouput terminal OUT. In addition, the diodes that are connected in series are for adjusting the threshold potential of the voltage that is input to the gate terminal of the second P-channel MOS transistor 41 and to the gate terminal of the third N-channel MOS transistor 43.

The operation of the first embodiment of the inverter circuit in accordance with the present invention that is constructed as in the foregoing will be described now by referring to FIG. 3.

To begin, the case in which the signal state at the input terminal IN changes from the low level (referred to as "L" level hereafter) to the high level (referred to as "H" level hereafter) will be described. Here, it is to be noted that prior to the above change in the signal state, the first NPN transistor 27 and the second N-channel MOS transistor 41 were in an on-state, the second NPN transistor 29 and the third N-channel MOS transistor 43 were in an off-state, and the potential of the ouput terminal OUT was at $V_{DD}$ due to feeding from the voltage source $V_{DD}$.

When an "H" level signal to the input terminal IN is supplied respectively to the gate terminals of the first P-channel MOS transistor 23 and the first N-channel MOS transistor 25 and to the base terminal of the third NPN transistor 31, the first P-channel MOS transistor 23 is turned off while the first N-channel MOS transistor 25 and the third NPN transistor 31 are turned on.

In this state, due to the change to the off state of the first P-channel MOS transistor 23, the first NPN transistor 27 turn off, and due to the change of the first N-channel MOS transistor 25 to the on-state, the charge that had been accumulated, during the "H" level state of the signal from the output terminal OUT, in a load capacity (not shown) connected to the output terminal OUT is supplied to the base terminal of the second NPN transistor 29 via the first N-channel MOS transistor 25, as the base current. Because of this, the second NPN transistor 29 turns on.

On the other hand, due to the change to the on-state of the third NPN transistor 31 the second P-channel MOS transistor 41 is changed to the off-state the third N-channel MOS transistor 43 is changed to the on-state, and further, due to the change of the third N-channel MOS transistor 43 to the on-state the second N-channel MOS transistor 39 is changed to the off-state.

By these changes, the charge that was accumulated in the load capacitor connected to the output terminal OUT flows into the voltage source $V_{SS}$ via the second NPN transistor 29. At the same time, a portion of the charge that was accumulated in the load capacitor flows into the voltage source $V_{SS}$ via the third N-channel MOS transistor 43. Then the potential at the output terminal OUT (output voltage) is lowered rapidly.

Now, when the ouput voltage drops from the potential $V_{DD}$ to the potential $(V_{SS}+V_{BE2})$, here, $V_{BE2}$ is the forward base-emitter voltage of the second NPN transistor 29 (curve A of FIG. 3), the voltage between the base terminal and the emitter terminal of the second NPN transistor 29 becomes $V_{BE2}$. Then, the second NPN bipolar transistor 29 turns off. Therefore, the charge that was accumulated in the load capacitor flows into the voltage source $V_{SS}$ solely via the third N-channel MOS transistor 43. By selecting large dimensions (ratio of W to L) of the third N-channel MOS transistor 43, the output voltage is dropped rapidly from the potential $(V_{SS}+V_{BE2})$ to the potential $V_{SS}$ (curve B of FIG. 3.) It should be noted here that since third N-channel MOS transistor 43 is driven by the third bipolar NPN transistor 31 with large current driving capability, the third N-channel MOS transistor 43 can be positively driven even if the dimensions of the third N-channel MOS transistor 43 are made large.

Consequently, the output voltage is dropped from the potential $V_{DD}$ to the potential $(V_{SS}+V_{BE2})$ mainly by the action of the second NPN transistor 29, and from the potential $(V_{SS}+V_{BE2})$ to the potential $V_{SS}$ mainly by the action of the third N-channel MOS transistor 43. Therefore, by the combined action of the bipolar transistor with high current driving capability and the MOS transistor whose current driving capability is enhanced through an increase in the dimensions of the transistor, it is possible to rapidly achieve a decrease in the ouput voltage from the potential $V_{DD}$ to the potention $V_{SS}$.

Next, the case in which the signal state at the input terminal IN changes from an "H" level to an "L" level while the output voltage is at the potential $V_{SS}$, will be described. When an "L" level signal is supplied to the respective gate terminals of the first P-channel MOS transistor 23 and the first N-channel MOS transistor 25 as well as to the base terminal of the third NPN transistor 31, the first P-channel MOS transistor 23 turns on, and the first N-channel MOS transistor 25 and the third NPN transistor 31 turns off.

In this condition, due to change of the first P-channel MOS transistor 23 to the on-state, the first NPN transistor 27 is changed to an on-state, and due to the change of the first N-channel MOS transistor 25 to an off-state, the second NPN transistor 29 is changed to an off-state. Then, a current is supplied from the voltage source $V_{DD}$, via the first NPN transistor 27, to the load capacitor and the gate terminal of the second N-channel MOS transistor 39 that are connected to the output terminal OUT. Because of this, along with a rapid rise in the output voltage, the potential of the gate terminal of the second N-channel MOS transistor 39 is raised and the second N-channel MOS transistor 39 turns on. Then, the third N-channel MOS transistor 43 turns off and the second P-channel MOS transistor 41 turns on, and a portion of the charge to be accumulated in the load capacitor is supplied by the voltage source $V_{DD}$ via the second P-channel MOS transistor 41.

Figure 3:
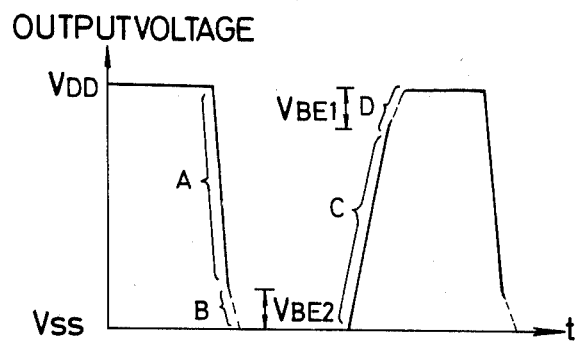
FIG. 3 is an explanatory diagram for illustrating the operation of the inverter circuit shown in FIG. 2.

When the output voltage is raised in this way from the potential $V_{SS}$ to the potential $(V_{DD}-V_{BE1})$, (here, $V_{BE1}$ is the forward base-emitter voltage of the first NPN transistor 27 as seen in curve C of FIG. 3), the first NPN transistor 27 turns off because the voltage between the base terminal and the emitter terminal of the first NPN transistor 27 becomes equal to $V_{BE1}$. Then, the charge to be accumulated in the load capacitor is supplied by the voltage source $V_{DD}$ only through the second P-channel MOS transistor 41. Therefore, the output voltage can be made to rise rapidly from the potential $(V_{DD}-V_{BE1})$ to the potential $V_{DD}$ by increasing the dimensions of the second P-channel MOS transistor 41 as seen in curve D of FIG. 3.

The gate terminal of the second N-channel MOS transistor 39 that drives the second P-channel MOS transistor 41 to an on-state is connected to the output terminal OUT which is connected to the load capacitor. Since the dimensions of the second N-channel MOS transistor 39 can be made large, the second N-channel MOS transistor 39 can positively drive the second P-channel MOS transistor 41 even if the dimensions of the second P-channel MOS transistor 41 are increased.

Consequently, the output voltage is raised from the potential $V_{SS}$ to the potential $(V_{DD}-V_{BE1})$ mainly by the action of the first NPN transistor 27, and from the potential $(V_{DD}-V_{BE1})$ to the potential $V_{DD}$ by the second P-channel MOS transistor 41. Thus, analogous to the falling behavior of the output voltage, the rising behavior of the output voltage from the potential $V_{SS}$ to the potential $V_{DD}$ can also be carried out rapidly.

Figure 4:
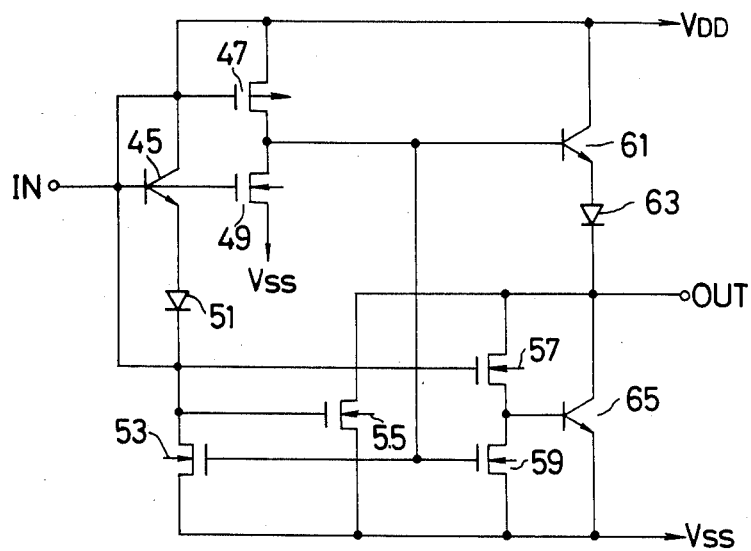
FIG. 4 is a block diagram of the inverter circuit relating to a second embodiment of the present invention.

FIG. 4 illustrates the inverter circuit relating to a second embodiment of the present invention. Here, the level of the output voltage is arranged to be comparable with the input-output level of the TTL digital circuit. First, the construction of the circuit will be described. As shown in FIG. 4, the input terminal IN to which is input a signal to be inverted is connected to the base terminal of a first NPN transistor 45, and to the respective gate terminals of a P-channel MOS transistor 47 and a first and a fourth N-channel MOS transistors 49 and 57.

The first NPN transistor 45 has its collector terminal connected, for example, to a voltage source $V_{DD}$ that supplied a potential $V_{DD}$, and its emitter terminal connected to the anode terminal of the diode 51. The P-channel MOS transistor 47 has its source terminal connected to the voltage source $V_{DD}$, its drain terminal connected to the drain terminal of the first N-channel MOS transistor 49, and the source terminal of the first N-channel MOS transistor 49 is connected to a voltage source $V_{SS}$ that supplies a potential $V_{SS}$ (ordinarily 0 V).

A second N-channel MOS transistor 53 has its gate terminal connected to the drain terminal of the P-channel MOS transistor 47, its drain terminal connected to the cathode terminal of the diode 51, and its source terminal connected to the voltage source $V_{SS}$. A third N-channel MOS transistor 55 has its gate terminal connected to the drain terminal of the second N-channel MOS transistor 53, its source terminal connected to the voltage source $V_{SS}$, and its drain terminal connected to the output terminal OUT from which the inverted signal is output.

A fourth N-channel MOS transistor 57 has its drain terminal connected to the output terminal OUT and its source terminal connected to the drain terminal of a fifth N-channel MOS transistor 59. The fifth N-channel MOS transistor 59 has its source terminal connected to the voltage source $V_{SS}$ and its gate terminal connected to the gate terminal of the second N-channel MOS transistor 53 as well as to the base terminal of a second bipolar NPN transistor 61. The collector terminal of the second NPN transistor 61 is connected to the voltage source $V_{DD}$ and its emitter terminal is connected to the cathode terminal of a diode 63, and the anode terminal of the diode 63 is connected to the output terminal OUT. A third bipolar NPN transistor 65 has its base terminal connected to the source terminal of the fourth N-channel MOS transistor 57, its collector terminal connected to the output terminal OUT, and its emitter terminal connected to the $V_{SS}$ terminal.

The operation of the second embodiment of the inverter circuit according to the present invention which is constructed as in the foregoing will now be described.

First, the case in which the signal condition at the input terminal IN is changed from the "L" level to the "H" level will be described. It is to be noted here that prior to this change in the signal condition, the second NPN transistor 61 was in an on-state, the third and fourth N-channel MOS transistors 55 and 57 and the third NPN transistor 65 were in an off-state, and the potential of the output terminal OUT was in the "H" level due to feeding from the voltage source $V_{DD}$ via the second NPN transistor 61.

When the "H" level signal that is input to the input terminal IN is supplied to the base terminal of the first NPN transistor 45 and the respective gate terminals of the P-channel MOS transistor 47, first N-channel MOS transistor 49, and the fourth N-channel MOS transistor 57, the P-channel MOS transistor 47 turns off and the first NPN transistor 45, and the first and fourth N-channel MOS transistors 49 and 57 turn on.

In this state, due to the change of the P-channel MOS transistor 47 to an off-state the second NPN transistor 61 is changed to an off-state, due to the change of the first N-channel MOS transistor 49 to an on-state the second N-channel MOS transistor 53 and the fifth N- channel MOS transistor 59 are changed to an off-state, and due to the change of the first NPN transistor 45 to an on-state the third N-channel MOS transistor 55 is changed to an on-state. Further, due to the change of the fourth N-channel MOS transistor 57 to an on-state, the charge, that had been accumulated in the load capacitor (not shown) connected to the output terminal OUT while the output terminal OUT had been in the "H" level signal state, is supplied to the base terminal of the third NPN transistor 65 as a base current. Because of this, the third NPN transistor 65 is changed to an on-state.

By these changes, the charge accumulated in the load capacitor which is connected to the output terminal OUT flows into the voltage source $V_{SS}$ via the third NPN transistor 65, and also a portion of the charge accumulated in the load capacitor flows into the voltage source $V_{SS}$ via the third N-channel MOS transistor 55. Therefore, analogous to the first embodiment, the output voltage drops fast from the potential $V_{DD}$ to the potential $V_{SS}$ by the combined action of the bipolar transistors with high current driving capability and the MOS transistors whose current driving capability is enhanced by increasing its dimensions. Moreover, the third N-channel MOS transistor 55 is driven by the first NPN transistor 45 which has high current driving capability so that it is possible to increase the dimensions of the transistor.

Next, the case in which, while the output voltage is at the potential $V_{SS}$, the signal state at the input terminal IN changes from the "H" level to the "L" level and is supplied to the base terminal of the first NPN transistor 45 and to the respective gate terminals of the P-channel MOS transistor 47, the first N-channel MOS transistor 49, and the fourth N-channel MOS transistor 57. As a result, the P-channel MOS transistor 47 turns off and the first NPN transistor 45, the first N-channel MOS transistor 49, and the fourth N-channel MOS transistor 57 turns to an turn on.

In this state, due to the change of the first NPN transistor 45 to an off-state the third N-channel MOS transistor 55 is changed to an off-state. Due to the change of the P-channel MOS transistor 47 to an on-state the second NPN transistor 61, the second N-channel MOS transistor 53, and the fifth N-channel MOS transistor 59 are changed to on-state. Due to the change of the fifth N-channel MOS transistor 59 to an on-state the third NPN transistor 65 is changed to an off-state.

By these changes, a current is supplied from the voltage source $V_{DD}$ to the load capacitor which is connected to the output terminal, via the second NPN transistor 61 and the diode 63. Then, the output voltage is raised rapidly to an "H" level output voltage $V_{OH}$, for instance, to about 3 V. This "H" level voltage is at least on the TTL logic level which is lower than the potential VDD by the sum of the forward base-emitter voltage of the second NPN transistor 61 and the forward voltage of the diode 63.

Accordingly, by the use of a circuit constructed as described in the foregoing, it becomes possible to obtain an "L" level output voltage $V_{OL}$ and an "H" level output voltage $V_{OH}$ that are comparable to those of the corresponding levels for the TTL logic circuit. Therefore, the present circuit becomes compatible with the TTL digital circuit.

Figure 5:
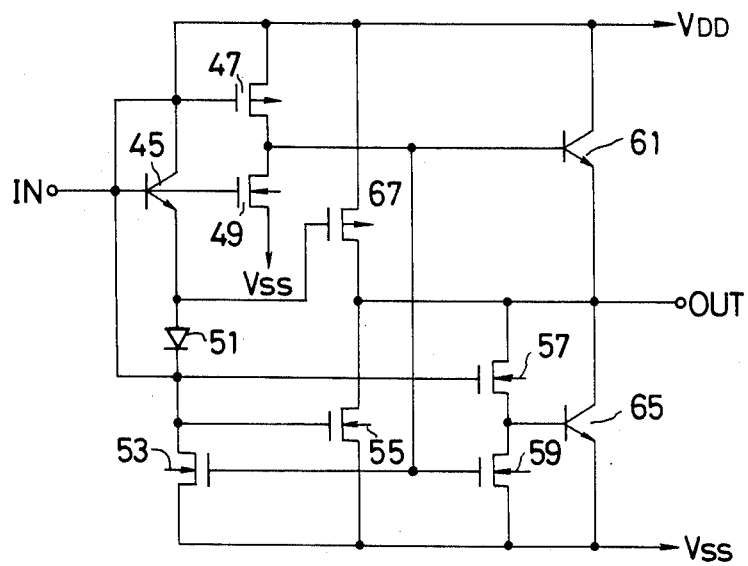
FIG. 5 is a block diagram of the inverter circuit relating to a third embodiment of the present invention.

FIG. 5 shows a third embodiment of the inverter circuit in accordance with the present invention. In contrast to the second embodiment in which the output voltage $V_{OH}$ of the inverter circuit is comparable to the "H" level of the TTL digital circuit, the inverter circuit of the third embodiment can raise the output voltage up to the potential $V_{DD}$. Its feature is that a P-channel MOS transistor 67 is connected in parallel to the second NPN transistor 61 of the inverter circuit shown in FIG. 4, with its gate terminal connected to the emitter terminal of the first NPN transistor 45. Thus, when the second NPN transistor 61 turns on, the P-channel MOS transistor 67 is brought to an on-state. There, a portion of the charge to be accumulated in the load capacitor (not shown) which is connected to the output terminal OUT is supplied to the load capacitor by the voltage source $V_{DD}$ via the P-channel MOS transistor 67. Analogous to the case for the first embodiment, it is designed to rapidly raise the output voltage to the potential $V_{DD}$ by enhancing the current driving capability of the P-channel MOS transistor 67 through increase in its dimensions.

In other words, by constructing an inverter circuit as described above, it becomes possible to achieve effects that are similar to those in the first embodiment. It should be noted that the parts with identical symbols represent the same components as in FIG. 4, and further explanation of them is thus omitted.

Various modifications will become possible for those skilled in the art after receiving the teachings of the present disclosure without departing from the scope thereof.

What is claimed is:

1. An inverter circuit comprising:

a first bipolar transistor having a base terminal, a collector terminal connected with a high voltage source and an emitter terminal connected with an output terminal;

a second bipolar transistor having a base terminal, an emitter terminal connected with a low voltage source and a collector terminal connected with said output terminal;

a first p-channel MOS transistor having a gate terminal connected with an input terminal, a source terminal connected with the high voltage source and a drain terminal connected with the base terminal of said first bipolar transistor;

a first n-channel MOS transistor having a gate terminal connected with said input terminal, a drain terminal connected with said output terminal and a source terminal connected with the base terminal of said second bipolar transistor;

a second p-channel MOS transistor having a gate terminal, a drain terminal connected with the high voltage source and a source terminal connected with said output terminal;

a second n-channel MOS transistor having a gate terminal, a drain terminal connected with said output terminal and a source terminal connected with the low voltage source;

a third bipolar transistor having a collector terminal connected with the high voltage source, an emitter terminal connected with the gate terminals of said second p- and second n-channel MOS transistors and a base terminal connected with said input terminal;

a third n-channel MOS transistor having a drain terminal connected with the emitter terminal of said third bipolar transistor, a gate terminal connected with said output terminal and a source terminal connected with the low voltage source.

2. An inverter circuit comprising:
- a first bipolar transistor having a base terminal, a collector terminal connected with a high voltage source and an emitter terminal connected with an output terminal;
- a second bipolar transistor having a base, an emitter terminal connected with a low voltage source and a collector terminal connected with said output terminal;
- a first p-channel MOS transistor having a gate terminal connected with an input terminal, a source terminal connected with the high voltage source and a drain terminal connected with the base terminal of said first bipolar transistor;
- a first n-channel MOS transistor having a gate terminal connected with said input terminal, a drain terminal connected with the base terminal of said first bipolar transistor and a source terminal connected with the low voltage source;
- a second n-channel MOS transistor having a gate terminal connected with said input terminal, a source terminal connected with the base terminal of said second bipolar transistor and a drain terminal connected with said output terminal;
- a third n-channel MOS transistor having a gate terminal connected with the base terminal of said first bipolar transistor, a drain terminal connected with the base terminal of said second bipolar transistor and a source terminal connected with the low voltage source;
- a third bipolar transistor having an emitter terminal, a collector terminal connected with the high voltage source and a base terminal connected with said input terminal;
- a fourth n-channel MOS transistor having a drain terminal connected with the emitter terminal of said third bipolar transistor, a gate terminal connected with the drain terminal of said first p-channel MOS transistor and a source terminal connected with the low voltage source; and
- a fifth n-channel MOS transistor having a drain terminal connected with said output terminal, a gate terminal connected with the emitter terminal of said third bipolar transistor and a source terminal connected with the low voltage source.

3. An inverter circuit of claim 2 further comprising a diode connected between the emitter terminal of said third bipolar transistor and the drain terminal of said fourth n-channel MOS transistor.

4. An inverter circuit of claim 2 further comprising a diode connected between the emitter terminal of said first bipolar transistor and said output terminal.

5. An inverter circuit of claim 2 further comprising a second p-channel MOS transistor having a source terminal connected with said high voltage source, a gate terminal connected with the emitter terminal of said third bipolar transistor and a drain terminal connected with said output terminal.

6. An inverter circuit comprising:
- a MOS inverter consisting of complementary MOS transistors each having input terminals connected with an input terminal of said inverter circuit and an output terminal;
- a first bipolar transistor having a collector terminal connected with a high voltage source, a base terminal connected with the output terminal of said MOS inverter and an emitter terminal connected with an output terminal of said inverter circuit; and
- a second bipolar transistor having a base terminal, an emitter terminal connected with a low voltage source, a collector terminal connected with said output terminal of said inverter circuit and means connected to said base term of said second bipolar transistor for changing the state of said second bipolar transistor responsive to a signal at said input terminal of said inverter circuit;
- a third bipolar transistor having an emitter terminal, a collector terminal connected with said high voltage source and a base terminal connected with said input terminal;
- a first n-channel transistor having a drain terminal connected with the emitter terminal of said third bipolar transistor, a gate terminal connected with the output terminal of said MOS inverter and a source terminal connected with the low voltage source; and
- a second n-channel MOS transistor having a drain terminal connected with the output terminal of said inverter circuit, a gate terminal connected with the emitter terminal of said third bipolar transistor and a source terminal connected with the low voltage source.

7. An inverter circuit of claim 6 wherein said means for changing the state of said second bipolar transistor comprises:
- a third n-channel MOS transistor having a gate terminal connected with said input terminal, a source terminal connected with the base terminal of said second bipolar transistor and a drain terminal connected with the output terminal of said inverter circuit; and
- a fourth n-channel MOS transistor having a gate terminal connected with the output terminal of said MOS inverter, a drain terminal connected with the base terminal of said second bipolar transistor and a source terminal connected with the low voltage source.

* * * * *